(12) United States Patent
Ohtsuka et al.

(10) Patent No.: US 7,176,480 B2
(45) Date of Patent: Feb. 13, 2007

(54) LIGHT-EMITTING SEMICONDUCTOR DEVICE HAVING A QUANTUM WELL ACTIVE LAYER, AND METHOD OF FABRICATION

(75) Inventors: Koji Ohtsuka, Niiza (JP); Junji Sato, Niiza (JP); Tetsuji Moku, Niiza (JP); Yoshitaka Tanaka, Niiza (JP); Mikio Tajima, Niiza (JP)

(73) Assignee: Sanken Electric Co., Ltd. (JP)

( * ) Notice: Subject to any disclaimer, the term of this patent is extended or adjusted under 35 U.S.C. 154(b) by 9 days.

(21) Appl. No.: 11/122,620

(22) Filed: May 5, 2005

(65) Prior Publication Data

US 2005/0191778 A1  Sep. 1, 2005

Related U.S. Application Data

(63) Continuation of application No. PCT/JP03/13858, filed on Oct. 29, 2003.

(30) Foreign Application Priority Data

Nov. 6, 2002  (JP)  ............................. 2002-322826

(51) Int. Cl.
  *H01L 29/06* (2006.01)
(52) U.S. Cl. ........................ 257/14; 257/9; 257/E33.08; 438/22

(58) Field of Classification Search ................. 257/14, 257/9, E33.08; 438/22
  See application file for complete search history.

(56) References Cited

U.S. PATENT DOCUMENTS 5,684,309 A * 11/1997 McIntosh et al. ........... 257/191

FOREIGN PATENT DOCUMENTS

| EP | 1 187 229 A1 | 3/2002 |
|---|---|---|
| JP | 08-264832 | 10/1996 |
| JP | 10-065271 | 3/1998 |
| JP | 10-084132 | 3/1998 |
| JP | 10-200214 | 7/1998 |
| JP | 2000-156544 | 6/2000 |
| JP | 2001-313421 | 11/2001 |
| JP | 2002-223042 | 8/2002 |
| JP | 2002-299685 | 10/2002 |

* cited by examiner

*Primary Examiner*—Andy Huynh
*Assistant Examiner*—Thinh T Nguyen
(74) *Attorney, Agent, or Firm*—Woodcock Washburn LLP

(57) ABSTRACT

A light-emitting diode has a low-resistivity silicon substrate on which there are laminated a buffer layer, an n-type lower confining layer, an active layer of multiple quantum well configuration, and a p-type upper confining layer. The active layer is constituted of cyclic alternations of a barrier sublayer of InGaN, a first complementary sublayer of AlGaInN, a well sublayer of InGaN, and a second complementary sublayer of AlGaInN. The proportions of the noted ingredients of the active sublayers are all specified. The first and the second complementary sublayers prevent the evaporation or diffusion of indium from the neighboring sublayers.

9 Claims, 2 Drawing Sheets

LIGHT-EMITTING SEMICONDUCTOR DEVICE HAVING A QUANTUM WELL ACTIVE LAYER, AND METHOD OF FABRICATION

CROSS REFERENCE TO RELATED APPLICATIONS

This is a continuation of Application PCT/JP2003/013858, filed Oct. 29, 2003, which claims priority to Japanese Patent Application No. 2002-322826 filed Nov. 6, 2002.

BACKGROUND OF THE INVENTION

This invention relates to light-emitting semiconductor devices such as what is called the light-emitting diode in common parlance, particularly to those employing nitrides or nitride-based compounds as semiconductors, and more particularly to an active layer of improved quantum well structure included in such light-emitting devices. The invention also pertains to a method of making such light-emitting semiconductor devices.

Japanese Unexamined Patent Publication Nos. 8-264832 and 2001-313421 are hereby cited as dealing with high-intensity light-emitting nitride semiconductor devices. For production of light ranging from ultraviolet to green, these known devices have their active region made from the class of gallium nitrides that are generally defined as $In_xAl_yGa_{1-x-y}N$ where x and y are both equal to or greater than zero and equal to or less than one and where the sum of x and y is equal to or greater than zero and equal to or less than one.

As heretofore constructed, light-emitting semiconductor devices have a substrate of sapphire, silicon carbide, or silicon on which there are grown gallium nitride semiconductor layers. In the case of a sapphire substrate, for instance, there is formed thereon a lamination of GaN buffer layers, a silicon-doped n-type GaN contact layer, an n-type AlGaN semiconductor layer, an active region of quantum well structure, a p-type AlGaN semiconductor layer, and a magnesium-doped p-type GaN contact layer, in that order from immediately over the substrate farther away therefrom.

Two different types of quantum well structures are known in the art: multiquantum well and single quantum well. The active region of both types includes a well layer or layers and barrier layers. Both well layers and barrier layers are made from InGaN for example, but the well layers contain indium in a greater proportion than do the barrier layers. The well layers are usually grown at temperatures not exceeding 800° C. with a view both to prevention of the decomposition of indium and to higher crystallinity. The usual practice in the art has been to grow the barrier layers approximately at the same temperature as the well layers. The resulting barrier layers have not necessarily been satisfactory in crystallinity, bringing about some difficulties and inconveniences set forth hereinbelow.

The barrier layers of poor crystallinity are, first of all, incapable of sufficiently restricting the vaporization of indium from the well layers, thereby allowing the well layers to deteriorate in crystallinity, too. Another inconvenience is the mutual diffusions of indium from the well layers and gallium from the barrier layers, beyond the interfaces between the well and barrier layers. The well layers have thus been easy to become irregular in virtual thickness, resulting in fluctuations in the wavelength of the light emitted. Furthermore, during the subsequent growth of the noted p-type GaN layer on the active region at 1100° C. or so, the barrier layers of poor crystallinity have further promoted both of indium evaporation from the well layers and the mutual diffusions of indium and gallium beyond the interfaces between the well and barrier layers. The diffusion of impurities such as magnesium from p-type GaN layer to active region, with the consequent deterioration of the crystallinity of the active region, has also had to be feared.

SUMMARY OF THE INVENTION

The present invention aims at provision of a light-emitting semiconductor device having a quantum-well active layer which is free from the difficulties and inconveniences of the prior art discussed in the foregoing, and of a method of fabricating such a quantum-well light-emitting device.

Briefly, the method of this invention is specifically directed to how the quantum-well active layer is fabricated in a light-emitting semiconductor device of the kind defined. The method dictates, first of all, the creation of a barrier sublayer of the active layer by organometallic chemical vapor deposition (OMCVD) on a preexisting semiconductor layer of a prescribed conductivity type included in the light-emitting semiconductor device. The barrier sublayer is of $In_yGa_{1-y}N$ where the subscript y is a numeral that is greater than zero and equal to or less than 0.5. Then a first complementary sublayer is formed by OMCVD on the barrier sublayer, the first complementary sublayer being of $Al_aGa_bIn_{1-a-b}N$ where the subscript a is a numeral that is greater than zero; the subscript b is a numeral that is less than one; and the sum of a and b is equal to or less than one. Then a well sublayer is formed by OMCVD on the first complementary sublayer, the well sublayer being of $In_xGa_{1-x}N$ where the subscript x is a numeral that is greater than zero, equal to or less than 0.5, and greater than y in the formula above defining materials for the barrier sublayer. Then a second complementary sublayer is formed by OMCVD on the well sublayer, the second complementary sublayer being of $Al_aGa_bIn_{1-a'-b'}N$ where the subscript a' is a numeral that is greater than zero; the subscript b' is a numeral that is less than one; and the sum of a' and b' is equal to or less than one. Then another barrier sublayer is formed by OMCVD on the second complementary sublayer, the second recited barrier sublayer being of $In_yGa_{1-y}N$ where the subscript y is a numeral that is greater than zero and equal to or less than 0.5.

Another aspect of the invention concerns the light-emitting semiconductor device having an active layer fabricated by the above summarized method. The active layer is a lamination of the barrier sublayer, the first complementary sublayer, the well sublayer, the second complementary sublayer, and the other barrier sublayer. The compositions of all these sublayers are as set forth above.

Made from an aluminum-nitride-based semiconductor, the second complementary sublayer functions to prevent the evaporation of indium and other ingredients from the well sublayer, and the mutual diffusions of indium from the well sublayer and gallium from the barrier sublayer. The first complementary sublayer of similar, but not necessarily identical, composition also serves the prevent the mutual diffusions of indium from the well sublayer and gallium from the barrier sublayer. The result is a significant improvement in the crystallinity of the active layer.

It is preferred that the active layer be of multiquantum well configuration, as in the preferred embodiments of the invention to be presented subsequently. A multiquantum well active layer is producible by cyclically repeating the sequential fabrication of one barrier sublayer, one first complementary sublayer, one well sublayer, and one second complementary sublayer a required number of times, and, finally, by fabricating an additional barrier layer on the last of such sets of sublayers.

In order to prevent indium evaporation and diffusion from the well layer or layers while the active layer as a whole is held relatively low in resistivity, the second complementary sublayer or sublayers may be made greater in aluminum content than the first complementary sublayer or sublayers. Generally, the higher the aluminum proportions a and a' of the $Al_aGa_bIn_{1-a-b}N$ first complementary sublayer or sublayers and $Al_{a'}Ga_{b'}In_{1-a'-b'}N$ second complementary sublayer or sublayers, the better will they reduce indium evaporation and diffusion. However, the first and second complementary sublayers will become more resistive as they grow higher in aluminum contents. As a compromise, and particularly in cases where the prevention of indium evaporation is more important, the second complementary sublayer or sublayers should be made as aforesaid greater in aluminum content than the first complementary sublayer or sublayers. This is believed to be the most practical solution to the problems of indium evaporation and indium and gallium diffusion.

Also, preferably, the second complementary sublayer or sublayers may be made thicker than the first complementary sublayer or sublayers. This difference in thickness will yield results similar to those obtained when the second complementary sublayer or sublayers are made greater in aluminum content as above than the first complementary sublayer or sublayers.

As has been set forth in the foregoing summary of the invention, the active layer is formed on a preexisting semiconductor layer of a prescribed conductivity type included in the light-emitting semiconductor device. This preexisting semiconductor layer is a lower confining layer, which is formed on a doped silicon substrate via a buffer layer, in one embodiment of the invention, and the buffer layer itself in another.

In either case the buffer layer may preferably take the form of a lamination of alternating first and second sublayers, each first sublayer being of $Al_xGa_{1-x}N$ where the subscript x is a numeral that is greater than zero and equal to or less than one and having a thickness determined to offer a quantum-mechanical tunnel effect, each second sublayer being of $Al_yGa_{1-y}N$ where the subscript y is equal to or greater than zero, less than one, and less than x in the formula defining materials for the first sublayer, and having a thickness in the range of from about 10 to about 500 nanometers. The buffer layer will then offer minimal electrical resistance.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION OF THE INVENTION

Figure 1:
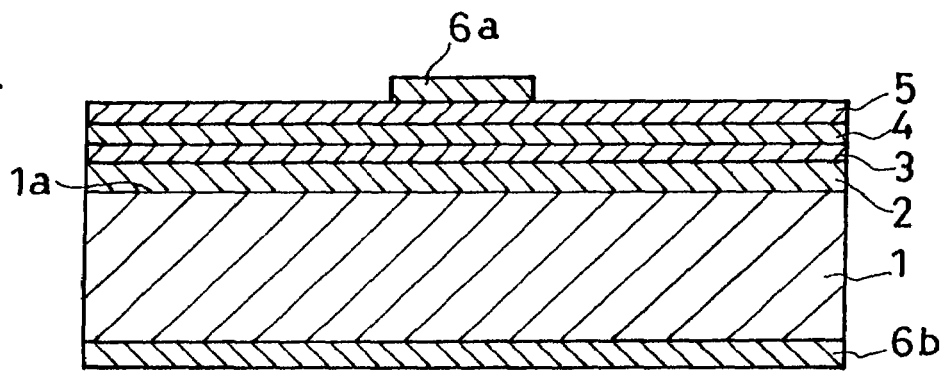
FIG. 1 is a schematic cross section through a first preferred form of light-emitting diode embodying the principles of this invention.

The gallium nitride light-emitting device according to the invention will now be described more specifically in terms of the light-emitting diode (LED) shown in FIG. 1. The method of fabricating this LED will be presented following the detailed explanation of its construction.

The illustrated LED has a low-resistivity substrate 1 of impurity-doped monocrystalline silicon. Formed on this substrate 1 is, first of all, an n-type buffer layer 2 shown in detail in FIG. 2, to which reference will be had presently. The buffer layer 2 is overlain by three main semiconductor layers 3, 4 and 5, which are arranged one on top of another in that order from the lowermost one upward. The lowermost main semiconductor layer 3 is an n-type cladding or confining layer; the intermediate semiconductor layer 4 is an active layer; and the topmost main semiconductor layer 5 is a p-type cladding or confining layer. The buffer layer 2 might be considered a part of the n-type semiconductor layer. Additional components of the LED are an anode or front electrode $6_a$ on top of the LED chip or of the p-type semiconductor layer 5, and a cathode or back electrode $6_b$ on the back of the LED chip or of the substrate 1.

Preferably, the substrate 1 is of n-type monocrystalline silicon doped with arsenic as a conductivity type determinant. The major surface $1_a$ of this silicon substrate 1 on which is formed the buffer layer 2 is exactly (111) in terms of Miller indices. The impurity concentration of the silicon substrate 1 is in the range of from $5 \times 10^{18}$ to $5 \times 10^{19}$ cm$^{-3}$, and its resistivity in the range of from 0.0001 to 0.0100 ohm-centimeter. The silicon substrate 1 in this resistivity range is electrically conductive enough to provide a current path between anode $6_a$ and cathode $6_b$ in the operation of the LED. The silicon substrate 1 should be sufficiently thick (e.g. 350 micrometers) to serve as a mechanical support for the buffer layer 2 and main semiconductor layers 3, 4 and 5 formed thereon.

Figure 2:
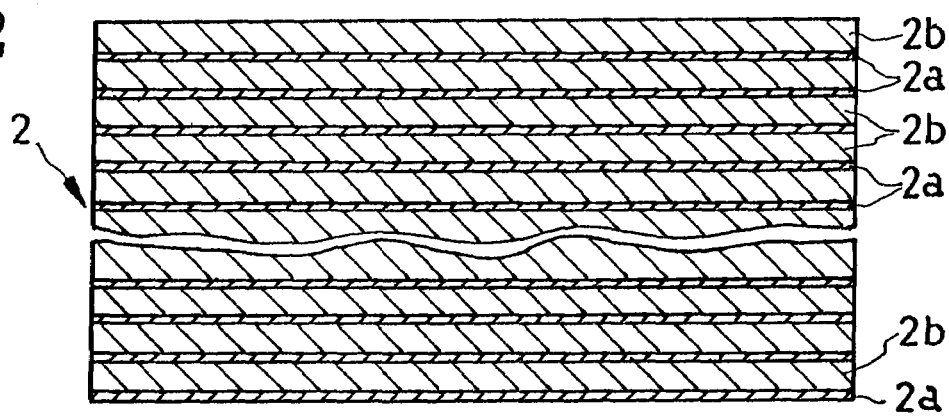
FIG. 2 is a greatly enlarged, partial section through the buffer layer of the light-emitting diode of FIG. 1.

As drawn fragmentarily and on a greatly enlarged scale in FIG. 2, the n-type buffer layer 2 is a lamination of a first and a second nitride semiconductor sublayer $2_a$ and $2_b$ arranged alternately a required number of times. Fifty first sublayers $2_a$ and fifty second sublayers $2_b$ alternate in this particular embodiment of the invention.

The first buffer sublayers $2_a$ are made from any of the nitrides that are generally expressed by the formula:

$$Al_xGa_{1-x}N$$

where the subscript x is a numeral that is greater than zero and equal to or less than one. Specific examples meeting this formula are aluminum nitride (AlN) and aluminum gallium nitride (AlGaN), out of which AlN (x is one in the formula above) is employed in this particular embodiment. The first buffer sublayers $2_a$ are electrically insulating and sufficiently thin to offer the quantum-mechanical tunnel effect. The first buffer sublayers $2_a$ are, moreover, closer in both lattice constant and thermal expansion coefficient to the silicon substrate 1, and therefore higher in buffering capability, than are the second buffer sublayers $2_b$.

The second buffer sublayers $2_b$ are made from, in addition to an n-type determinant, any of the nitrides that are generally expressed by the formula:

$$Al_yGa_{1-y}N$$

where the subscript y is a numeral that is equal to or greater than zero and less than one and, additionally less than x in the formula above defining the materials for the first buffer sublayers $2_a$. Thus the second buffer sublayers $2_b$ can be made from GaN or AlGaN plus an n-type determinant. The second buffer sublayers $2_b$ are each greater in thickness than each first buffer sublayer $2_a$. Preferably, in cases where n-type AlGaN is employed for the second buffer sublayers $2_b$, the value of y should be greater than zero and less than 0.8 in order to keep the second buffer sublayers from becoming too high in electrical resistivity. The second buffer sublayers $2_b$ function as conductors or semiconductors for electrical connection of the first buffer sublayers $2_a$.

The first buffer sublayers $2_a$ are each from 0.5 to 10 nanometers thick, preferably from one to eight nanometers. The three overlying main semiconductor layers 3–5 would not all gain a desired degree of flatness if the first buffer sublayers $2_a$ were each less than 0.5 nanometer thick. If they exceed 10 nanometers in thickness, on the other hand, the quantum-mechanical tunnel effect would not be obtained, and the buffer layer 2 as a whole would inconveniently rise in electrical resistivity.

The second buffer sublayers $2_b$ are each from 10 to 500 nanometers thick, preferably from 10 to 300 nanometers. Should each second buffer sublayer $2_b$ be less than 10 nanometers thick, the energy band between substrate 1 and the second buffer sublayer $2_b$ would become so discontinuous that both resistivity and voltage would become unnecessarily high between anode $6_a$ and cathode $6_b$ during the operation of the device. Also, if each second buffer sublayer $2_b$ were less than 10 nanometers thick, electrical connection would not be established sufficiently between the two adjoining first buffer sublayers $2_a$ on the opposite sides of each second buffer sublayer $2_b$, resulting in an increase in the resistivity of the buffer layer 2. Should each second buffer sublayer $2_b$ exceed 500 nanometers in thickness, on the other hand, then the first buffer sublayers $2_a$ would become so small in size in relation to the complete buffer layer 2 that the latter would not perform its intended functions to the full. The intended functions of the buffer layer 2 are to improve the crystallinity and flatness of the overlying main semiconductor layers 3–5.

Overlying the buffer layer 2 of the FIG. 2 configuration, the n-type main semiconductor layer 3 is made from any of the n-type gallium nitrides semiconductors that are generally expressed as:

$$Al_xGa_{1-x}N$$

where the subscript x is a numeral that is equal to or greater than zero and less than one. The particular semiconductors meeting these requirements are n-type GaN and n-type AlGaN. The particular material employed in this embodiment of the invention is n-type GaN (x is zero in the formula above).

Figure 3:
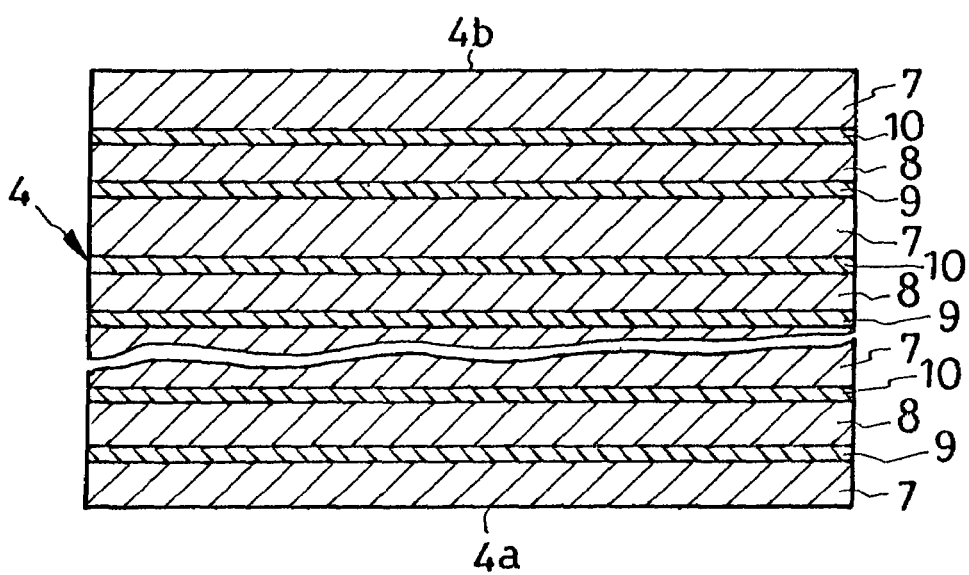
FIG. 3 is a greatly enlarged, partial section through the active layer of the light-emitting diode of FIG. 1.

As illustrated in detail in FIG. 3, the multi-quantum-well active layer 4 on the n-type main semiconductor layer 3 is a lamination of barrier sublayers 7, well sublayers 8, first complementary sublayers 9, and second complementary sublayers 10. It will be observed from this figure, taken together with FIG. 1, that the active layer 4 has a whole has one major surface $4_a$, which is contiguous to the n-type main semiconductor layer 3, and another major surface $4_b$ on which is formed the p-type main semiconductor layer 5. One barrier sublayer 7, one first complementary sublayer 9, one well sublayer 8, and one second complementary sublayer 10, arranged in that order from the one major surface $4_a$ of the active layer 4 toward the other $4_b$, constitute one of a required number of sets of such sublayers of the active layer.

An additional barrier sublayer 7 overlies the topmost set of active sublayers 7–10. This arrangement of the active sublayers may be restated that the required number of sublayer sets, each consisting of one first complementary sublayer 9, one well sublayer 8, one second complementary sublayer 10, and one barrier sublayer 7, are laminated upon the bottommost barrier sublayer 7 directly overlying the n-type main semiconductor layer 3. The active layer 4 is composed of fifteen well sublayers 8, fifteen first complementary sublayers 9, fifteen second complementary sublayers 10⁻, and sixteen barrier sublayers 7 in this embodiment of the invention.

The barrier sublayers 7 of the active layer 4 are fabricated from any of the indium gallium nitride semiconductors that can be generally defined as:

$$In_yGa_{1-y}N$$

where the subscript y is a numeral that is greater than zero and equal to or less than 0.5. A preferred range of values for the subscript y is from 0.01 to 0.10, and most desirably from 0.01 to 0.05. The barrier sublayers 7 are made from $In_{0.03}Ga_{0.97}$ (y is 0.03 in the formula above) in this particular embodiment of the invention. Each barrier sublayer 7 can be from five to 20 nanometers thick and is 10 nanometers in this embodiment. The barrier sublayers 7 have a bandgap in the energy band diagram that is greater than that of the well sublayers 8.

The well sublayers 8 of the active layer 4 are made from any of the indium gallium nitride semiconductors that can be generally defined as:

$$In_xGa_{1-x}N$$

where the subscript x is a numeral that is greater than zero, equal to or less than 0.5, and greater than the subscript y of the formula above defining the materials for the barrier sublayers 7. The indium proportion x of the well sublayer materials is made higher than that y of barrier sublayer materials in order for the well sublayers to be less in bandgap than the barrier sublayers. More specifically, x is in the range of from 0.01 to 0.40, preferably from 0.02 to 0.30. The particular material employed for the well sublayers 8 in this embodiment of the invention is $In_{0.2}Ga_{0.8}N$ (x is 0.2). Each well sublayer 8 may be from one to ten nanometers thick and is three nanometers in this embodiment.

Each interposed between one well sublayer 8 and one underlying barrier sublayer 7, the first complementary sublayers 9 of the active layer 4 are intended for preventing the mutual diffusion of gallium from the barrier sublayers and of indium from the well sublayers. These first complementary sublayers 9 are made from any of the aluminum-containing nitride semiconductors that are generally expressed by the formula:

$$Al_aGa_bIn_{1-a-b}N$$

where the subscript a is a numeral that is greater than zero; the subscript b is a numeral that is less than one; and the sum of a and b is equal to or less than one.

The specific substances that meet these requirements are AlN, AlGaN, and AlGaInN. The aluminum proportion a is preferably in the range of from 0.01 to 0.90, most desirably from 0.1 to 0.7. The particular substance employed for the first complementary sublayers 9 is $Al_{0.5}Ga_{0.5}N$ (both a and b are 0.5). The aluminum proportion a for the first complementary sublayers 9 may be made less than the aluminum proportion a' for the second complementary sublayers 10, which are to be detailed subsequently, for reasons that are also to be set forth in connection with the second complementary sublayers. Each first complementary sublayer 9 is from 0.1 to 20 nanometers thick, preferably from 0.5 to 1.5 nanometers thick, and 0.8 nanometer thick in this particular embodiment. The first complementary sublayers 9 may be made thinner than the second complementary sublayers 10 for the same reasons the aluminum proportion a is made less than the aluminum proportion a' as above.

The second complementary sublayers 10 of the active layer 4, each interposed between one well sublayer 8 and one overlying barrier sublayer 7, serve mainly to prevent evaporation of indium from the well sublayers. These second complementary sublayers 10 are made from any of the aluminum-containing nitride semiconductors that are generally expressed by the formula:

$$Al_aGa_bIn_{1-a'-b'}N$$

where the subscript a' is a numeral that is greater than zero and, preferably, than the subscript a in the formula above defining the materials for the first complementary sublayers 9 of the active layer 4; the subscript b' is a numeral that is equal to or less than one; and the sum of a' and b' is equal to or less than one.

The specific substances that may be employed for the second complementary sublayers 10 are AlN, AlGaN, and AlGaInN. Preferably, the aluminum proportion a' in the formula for the second complementary sublayers 10 is in the range of from 0.01 to 1.00, and from 0.1 to 1.0 for the best results. The aluminum proportion a' is one, and the gallium proportion b' is zero, in this particular embodiment; in other words, the second complementary sublayers 10 are made from AlN.

Furthermore, in order effectively to prevent the vaporization of indium by the second complementary sublayers 10, the aluminum proportion a' of these sublayers should be greater than the aluminum proportion a of the first sublayers 9, and the second complementary sublayers should be thicker than the first complementary sublayers. Each second complementary sublayer 10 is from 0.5 to 3.0 nanometers thick, preferably from one to two nanometers thick, and 1.5 nanometers thick in this particular embodiment.

As is clear from the foregoing, the first complementary sublayers 9 of the active layer 4 are intended primarily for prevention of the mutual diffusion of gallium from the barrier sublayers 7 and of indium from the well sublayers 8. The second complementary sublayers 10 on the other hand are intended primarily for prevention of the vaporization of indium from the well sublayers 8. The aluminum contents of both first and second complementary sublayers 9 and 10 are effective for the prevention of both the mutual diffusions of gallium and indium and the vaporization of indium.

However, the greater the aluminum proportions a and a' are in the complementary sublayers 9 and 10, the higher will these sublayers be in electrical resistivity. The complementary sublayers 9 and 10 will also gain in electrical resistivity as they grow thicker. Limitations must therefore be imposed upon both the aluminum proportions a and a' and thicknesses of the complementary sublayers 9 and 10. Improvement in the performance of the active layer 4 due to the prevention of indium vaporization by the aluminum content of the second complementary sublayers 10 is more pronounced than that due to the prevention of the mutual diffusions of gallium and indium by the aluminum content of the first complementary sublayers 9. It is therefore practical to make the aluminum proportion a' of the second complementary sublayers 10 higher than the aluminum proportion a of the first complementary sublayers 9, and to make the second complementary sublayers 10 thicker than the first complementary sublayers 9.

With reference back to FIG. 1 the p-type main semiconductor layer 5 on the active layer 4 of foregoing configuration is fabricated from, in addition to a p-type dopant, either GaN or AlGaN which can be generally expressed as:

$$Al_yGa_{1-y}N$$

where the subscript y is a numeral that is equal to or greater than zero and less than one. The particular substance employed in this embodiment is p-type GaN (y is zero in the formula above). Optionally, an additional gallium nitride layer such as that of p-type AlGaN might be interposed between active layer 4 and p-type main semiconductor layer 5.

Mounted centrally on the surface of the p-type main semiconductor layer 5, the anode $6_a$ is electrically connected to that layer 5. The anode 6a could be mounted to the main semiconductor layer 5 via a p-type contact layer. Another possible modification is the interposition of a known current limiting layer between active layer 4 and anode $6_a$. The cathode $6_b$ is mounted to the underside of the substrate 1 and electrically coupled thereto.

What follows is the disclosure of a preferred method of making the LED of the FIGS. 1–3 construction. The method started with the preparation of the substrate 1 which was of silicon to which there was added an n-type dopant to provide an $n^+$-type silicon substrate. The major surface $1_a$ of the silicon substrate 1, on which was to be formed the buffer layer 2, was precisely (111) in terms of Miller indices, although deviations from this plane to the extent of several angular degrees are permissible.

Then the buffer layer 2 was formed on the major surface $1_a$ of the substrate 1 as part of the first conductivity type semiconductor region. As depicted in detail in FIG. 2, the buffer layer 2 was a lamination of alternating AlN sublayers $2_a$ and GaN sublayers $2_b$, both made by known organometallic chemical vapor deposition (OMCVD), known also as metalorganic chemical vapor deposition (MOCVD).

Introduced into the reactor of a commercially available OMCVD system, the monocrystalline silicon substrate 1 was first put to thermal annealing for stripping the oxide films off its surfaces. Then trimethylaluminum (TMA) gas and ammonia (NH$_3$) gas was charged into the reactor for 27 seconds, thereby growing a first buffer sublayer $2_a$ of AlN to a thickness of approximately five nanometers on the surface $1_a$ of the substrate 1. The TMA gas (i.e. aluminum) was charged at a rate of approximately 63 micromoles per minute, and the NH$_3$ gas at a rate of approximately 0.14 mole per minute, with the substrate 1 heated to a temperature of 1120° C.

Then, with the supply of TMA gas terminated and the substrate temperature held at 1120° C., trimethylgallium (TMG) gas, NH$_3$ gas and silane (SiH$_4$) gas were introduced into the reactor for 83 seconds. There was thus grown on the first buffer sublayer $2_a$ a second buffer sublayer $2_b$ of n-type GaN to a thickness of approximately 30 nanometers. The SiH$_4$ gas was intended for addition of silicon into the GaN sublayer $2_b$ as an n-type dopant. The TMG gas (i.e. gallium) was charged at a rate of 63 micromoles per minute, the NH$_3$ gas at a rate of 0.14 mole per minute, and the SiH$_4$ gas (i.e. silicon) at a rate of 21 nanomoles per minute.

The above described process of fabricating one first AlN buffer sublayer $2_a$ and one second GaN buffer sublayer $2_b$ was repeated 50 times. There was thus completed the buffer layer 2 in the form of a lamination of 100 alternating first AlN sublayers $2_a$ and second GaN sublayers $2_b$. It is of course understood that the buffer layer 2 can be of an arbitrary number (i.e. 25) of alternating sublayers $2_a$ and $2_b$.

Next came the steps of growing the n-type main semiconductor layer 3, active layer 4, and p-type main semiconductor layer 5 on the buffer layer 2 by OMCVD. The n-type main semiconductor layer 3 of n-type GaN was first formed on the buffer layer 2 by introducing TMG gas, $NH_3$ gas and $SiH_4$ gas into the OMCVD reactor, with the substrate 1, together with the buffer layer 2 thereon, held at a temperature of 1040° C. The TMG gas was introduced at a rate of 4.3 micromoles per minute, the $NH_3$ gas at a rate of 53.6 millimoles per minute, and the $SiH_4$ gas at a rate of 1.5 nanomoles per minute. The $SiH_4$ gas was intended for introduction of silicon into the n-type main semiconductor layer 3 as an n-type impurity.

The n-type main semiconductor layer 3 was thus grown to a thickness of 0.2 micrometer, which is significantly less than the usual thickness (from 4.0 to 5.0 micrometer) of the n-type semiconductor layers of prior art LEDs of comparable design. The impurity concentration of this main semiconductor layer 3 was approximately $3 \times 10^{18}$ $cm^{-3}$, sufficiently less than that of the substrate 1. Overlying the substrate 1 via the buffer layer 2, instead of directly, the main semiconductor layer 3 could be grown at as high a temperature as 1040° C.

The next step was the creation of the active layer 4 which, as shown in detail in FIG. 3, is a lamination of alternating barrier sublayers 7, well sublayers 8, and first and second complementary sublayers 9 and 10. The lowermost barrier sublayer 7 of $In_yGa_{1-y}N$ was first formed on the main semiconductor layer 3 by OMCVD. The substrate 1 with the buffer layer 2 and main semiconductor layer 3 thereon was heated to 800° C., and the gases of TMG, $NH_3$, and trimethyl indium (TMI) were charged into the OMCVD reactor. The TMG gas was charged at a rate of 1.1 micromoles per minute, and the TMI gas at 1.0 micromole per minute. The barrier sublayer 7 was grown to a thickness of approximately 10 nanometers, and its composition was $In_{0.03}Ga_{0.97}N$.

Then one first complementary sublayer 9 of $Al_aGa_bIn_{1-a-b}N$ was grown on the lowermost barrier sublayer 7. The gases of TMG, $NH_3$, and trimethylaluminum (TMA) were charged into the OMCVD reactor, the TMG gas at a rate of 1.1 micromoles per minute, and the TMA gas at a rate of 1.2 micromoles per minute. The composition of the resulting first complementary sublayer 9 was $Al_{0.5}Ga_{0.5}N$ (a=0.5, b=0.5).

Then one well sublayer 8 of $In_xGa_{1-x}N$ was grown on the first complementary sublayer 9. The gases of TMG, $NH_3$, and TMI were charged into the OMCVD reactor, the TMG gas at a rate of 1.1 micromoles per minute, and the TMI gas at a rate of 4.5 micromoles per minute. The well sublayer 8 was grown to a thickness of approximately three nanometers.

Then one second complementary sublayer 10 of $Al_{a'}Ga_{b'}In_{1-a'-b'}N$ was grown on the well sublayer 8 by introducing both $NH_3$ and TMA gases into the OMCVD reactor. The TMA gas was introduced at a rate of 2.4 micromoles per minute. The composition of the resulting second complementary sublayer 10 was AlN (a'=1, b'=0).

The foregoing processes of fabricating one barrier sublayer 7, one first complementary sublayer 9, one well sublayer 8 and one second complementary sublayer 10 were cyclically repeated until the active layer 4 was completed which consisted of the required alternations of these sublayers.

The next step was the fabrication of the p-type main semiconductor layer 5, FIG. 1, on the active layer 4 which had been completed as above. The substrate 1 with the various layers and sublayers so far made thereon was heated to 1040° C., and there were introduced into the OMCVD reactor the gases of TMG, $NH_3$, and bis-cyclopentadienyl-magnesium ($Cp_2Mg$). The $Cp_2Mg$ gas was intended for addition of magnesium to the main semiconductor layer 5 as a p-type conductivity determinant. The TMG gas was introduced at a rate of 4.3 micromoles per minute, the $NH_3$ gas at a rate of 53.6 micromoles per minute, and $Cp_2Mg$ at a rate of 0.12 micromoles per minute.

There was thus grown on the surface of the active layer 4 the main semiconductor layer 5 of p-type GaN. This main semiconductor layer 5 had a thickness of approximately 0.2 micrometer and an impurity concentration of approximately $3 \times 10^{18}$ $cm^{-3}$.

With the LED chip fabricated by OMCVD as above, the component layers of the chip have proved to be all well aligned in crystal orientation. The buffer layer 2 grew in good conformity with the orientation to the monocrystalline silicon substrate 1, and the main semiconductor layers 3–5 were well aligned in orientation with the buffer layer.

In order to complete the LED, the anode $6_a$ was formed centrally on the front surface of the LED chip by vacuum deposition of nickel and gold. The anode $6_a$ made low-resistance contact with the surface of the p-type main semiconductor layer 5. Light is emitted from that part of the surface of the main semiconductor layer 5 which was left uncovered by the anode $6_a$. The cathode $6_b$ was formed on the underside of the chip by vacuum deposition of titanium and aluminum.

Constructed and fabricated as in the foregoing, the LED of FIGS. 1–3 offers the following advantages:

1. The second complementary sublayers 10 of the multiple well active layer 4, each interposed between one well sublayer 8 and one barrier sublayer 7 thereover, prevent the evaporation of indium from the underlying well sublayers during the deposition of the barrier sublayers thereon. Thus the well sublayers 8 have their crystallinity left unimpaired, and the barrier sublayers 7 are saved from the deterioration of crystallinity by indium intrusion from the well sublayers, assuring material improvement in the performance of the LED.

2. The first complementary sublayers 9, each interposed between one well sublayer 8 and one barrier sublayer 7 thereunder, reduce the mutual diffusions of gallium from the barrier sublayers and indium from the well sublayers due to heat application during the fabrication of the active layer 4 and main semiconductor layer 5 or during any subsequent manufacturing processes.

3. The second complementary sublayers 10 coact with the first 9 further to reduce the mutual diffusions of gallium and indium between he barrier sublayers 7 and well sublayers 8, making these sublayers still better in crystallinity and contributing toward further enhancement of the LED performance.

4. Indium evaporation from the well sublayers 8 is curtailed as the second complementary sublayers 10 are made higher in aluminum content, and greater in thickness, than the first 9.

5. The first complementary sublayers 9 are prevented from becoming too high in electrical resistivity as they are made less in aluminum content and in thickness than the second complementary sublayers 10.
6. The active layer 4 is kept from deterioration of crystallinity as both complementary sublayers 9 and 10 restrict the diffusion of the conductivity determinant of the main semiconductor layer 5 into the active layer.
7. Having a lattice constant intermediate those of the silicon substrate 1 and GaN buffer sublayers $2_b$, the AlN buffer sublayers $2_a$ faithfully conform to the crystal orientation of the substrate. This in turn permits the GaN semiconductors of the main semiconductor layers 3 and 5 and active layer 4 to be grown on the buffer layer 2 with their crystal orientation aligned for high intensity light emission.
8. The main semiconductor layers 3 and 5 and active layer 4 are formed with a high degree of flatness as they overlie a lamination of a multiplicity of buffer sublayers $2_a$ and $2_b$. Should the buffer layer consist solely of GaN semiconductor, the main semiconductor layer 3 and other GaN layers would not be flat enough by reason of too much difference in lattice constant between Si and GaN. Also, the buffer layer would become too high in resistivity if it consisted solely of a relatively thick AlN layer, and would not provide a sufficient buffering action if it were a relatively thin AlN layer. Made up of alternating first sublayers $2_a$ of AlN, which differs only slightly from silicon in lattice constant, and second sublayers $2_b$ of GaN, the buffer layer 2 according to the invention makes it possible to form the GaN semiconductor layers thereon with a high degree of flatness and crystallinity.
9. The individual first sublayers $2_a$ of the buffer layer 2 have their thickness determined to offer the quantum-mechanical tunnel effect, so that the buffer layer as a whole is held relatively low in resistivity.
10. The LED chip is kept from warping as a result of a difference in thermal expansion coefficient between the silicon substrate 1 and GaN semiconductor region such as the main semiconductor layer 3. Being so different in thermal expansion coefficient, the silicon and GaN layers when placed in direct contact with each other would present a certain cause for warpage. This cause is precluded according to the invention by the interposition of the laminated buffer layer 2. The AlN sublayers $2_a$ of this buffer layer are intermediate in thermal expansion coefficient between silicon substrate 1 and GaN main semiconductor layer 3, and the mean thermal expansion coefficient of the complete buffer layer 2 is also intermediate the thermal expansion coefficients of the substrate 1 and main semiconductor layer 3. Hence the elimination of chip warpage.
11. With the second buffer sublayers $2_b$ made as thick as 30 nanometers, the appearance of discrete energy levels is minimized in the valence band and conduction band of the second buffer sublayers, resulting in prevention of an increase in energy level that has to do with carrier conduction in these sublayers. That is to say that both buffer sublayers $2_a$ and $2_b$ are saved from gaining a superlattice state. As the discontinuity of the energy band between substrate 1 and second buffer sublayers $2_b$ is thus prevented from worsening, the resistance between anode $6_a$ and cathode $6_b$ is reduced, and so is the voltage to be applied therebetween.

Figure 4:
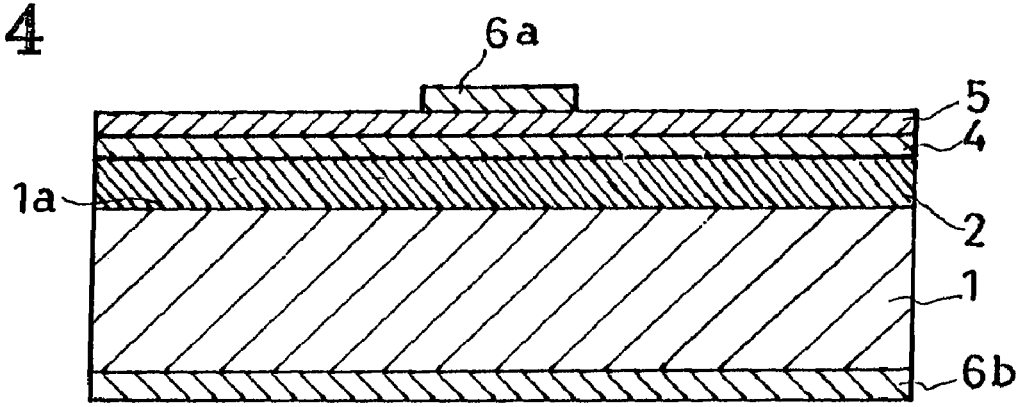
FIG. 4 is a schematic cross section through another preferred form of light-emitting diode according to the invention.

FIG. 4 shows an alternative form of LED embodying the principles of the invention. This alternative LED represents a slight modification of its FIG. 1 counterpart, being akin thereto except that the FIG. 4 device has no n-type main semiconductor layer or lower confining layer 3. The active layer 4 directly overlies the n-type buffer layer 2 in the modified device, so that the buffer layer serves the purpose of a lower confining layer as well.

The modified LED gains the advantage that the active layer 4 is subject to less tensile stress than in the FIG. 1 device in which the active layer overlies the relatively thick lower confining layer 3. The active layer 4 is therefore so much the better in crystallinity, contributing to the higher performance of the LED.

Notwithstanding the foregoing detailed disclosure it is not desired that the present invention be limited by the exact showings of the drawings or the description thereof. The following is a brief list of possible modifications, alterations or adaptations of the invention which are all believed to fall within the purview of the claims which follow.

1. The substrate 1 need not necessarily be of monocrystalline silicon but may for example be of polycrystalline silicon, a silicon compound such as silicon carbide, or sapphire.
2. The substrate 1, buffer layer 2, lower confining layer 3, active layer 4 and upper confining layer 5 are all reversible in conductivity types.
3. The buffer layer 2 and confining layers 3 and 5 could be fabricated from any such gallium- or indium-nitride-based compound semiconductors as gallium nitride, aluminum indium nitride, aluminum gallium nitride, indium gallium nitride, and aluminum indium gallium nitride.
4. The confining layers 3 and 5 could each be a lamination of sublayers of different compositions.
5. The anode $6_a$ could be transparent.
6. The first buffer sublayers $2_a$ could be made greater in number than the second buffer sublayers $2_b$ by one, so as to occupy both topmost and bottommost sublayers of the buffer layer 2.
7. The second buffer sublayers $2_b$ could likewise occupy both topmost and bottommost sublayers of the buffer layer 2.
8. The active layer 4 could be of a single-quantum-well, rather than multiple-quantum-well, structure, in which case the active layer might be constituted of one well sublayer 8, two barrier sublayers 7, and two complementary sublayers 9 and 10.
9. Any one or more of the constitute sublayers 7–10 of the active layer 4 could be doped with n- or p-type impurities.
10. The cathode $6_b$ could be coupled directly to the buffer layer 2.

The invention claimed is:

1. A method of creating an active layer of quantum well structure on a semiconductor layer of a prescribed conductivity type in a light-emitting semiconductor device, the method comprising the steps of:
   (a) forming a barrier sublayer on the semiconductor layer by organometallic chemical vapor deposition, the barrier sublayer being of $In_yGa_{1-y}N$ where the subscript y is a numeral that is greater than zero and equal to or less than 0.5;
   (b) forming a first complementary sublayer on the barrier sublayer by organometallic chemical vapor deposition, the first complementary sublayer being of $Al_aGa_b In_{1-a-b}N$ where the subscript a is a numeral that is greater than zero; the subscript b is a numeral that is less than one; and the sum of a and b is equal to or less than one;
   (c) forming a well sublayer on the first complementary sublayer by organometallic chemical vapor deposition, the well sublayer being of $In_xGa_{1-x}N$ where the subscript x is a numeral that is greater than zero, equal to or less than 0.5, and greater than y in the formula defining materials for the barrier sublayer;

(d) forming a second complementary sublayer on the well sublayer by organometallic chemical vapor deposition, the second complementary sublayer being of $Al_{a'}Ga_{b'}In_{1-a'-b'}N$ where the subscript a' is a numeral that is greater than zero; the subscript b' is a numeral that is less than one; and the sum of a' and b' is equal to or less than one;

(e) forming another barrier sublayer on the second complementary sublayer by organometallic chemical vapor deposition, the second recited barrier sublayer being of $In_yGa_{1-y}N$ where the subscript y is a numeral that is greater than zero and equal to or less than 0.5.

2. The method of claim 1 which further comprises cyclically repeating, after step (e), steps (b), (c), (d) and (e) a preselected number of times for production of an active layer of multiple quantum well structure.

3. The method of claim 1 wherein the aluminum proportion a' of the second complementary sublayer, or each second complementary sublayer, of the active layer is greater than the aluminum proportion a of the first complementary sublayer, or each complementary sublayer, of the active layer.

4. The method of claim 1 wherein the second complementary sublayer, or each second complementary sublayer, of the active layer is thicker than the first complementary sublayer, or each first complementary sublayer, of the active layer.

5. A light-emitting semiconductor device having an active layer of quantum well structure between two confining semiconductor layers of opposite conductivity types, the active layer comprising:

(a) a barrier sublayer formed on one of the confining semiconductor layers, the barrier sublayer being of $In_yGa_{1-y}N$ where the subscript y is a numeral that is greater than zero and equal to or less than 0.5;

(b) a first complementary sublayer formed on the barrier sublayer, the first complementary sublayer being of $Al_aGa_bIn_{1-a-b}N$ where the subscript a is a numeral that is greater than zero; the subscript b is a numeral that is less than one; and the sum of a and b is equal to or less than one;

(c) a well sublayer formed on the first complementary sublayer, the well sublayer being of $In_xGa_{1-x}N$ where the subscript x is a numeral that is greater than zero, equal to or less than 0.5, and greater than y in the formula above defining materials for the barrier sublayer;

(d) a second complementary sublayer formed on the well sublayer, the second complementary sublayer being of $Al_{a'}Ga_{b'}In_{1-a'-b'}N$ where the subscript a' is a numeral that is greater than zero; the subscript b' is a numeral that is less than one; and the sum of a' and b' is equal to or less than one; and (e) an additional barrier sublayer formed on the second complementary sublayer, the additional barrier sublayer being of $In_yGa_{1-y}N$ where the subscript y is a numeral that is greater than zero and equal to or less than 0.5.

6. The light-emitting semiconductor device of claim 5 further comprising a plurality of cyclic alternations of the first complementary sublayer and the well sublayer and the second complementary sublayer and the barrier sublayer, which are formed on the additional barrier sublayer of the first recited set of such sublayers in order to provide a multiple quantum well active layer.

7. The light-emitting semiconductor device of claim 5 wherein the aluminum proportion a' of the second complementary sublayer, or each second complementary sublayer, of the active layer is greater than the aluminum proportion a of the first complementary sublayer, or each complementary sublayer, of the active layer.

8. The light-emitting semiconductor device of claim 5 wherein the second complementary sublayer, or each second complementary sublayer, of the active layer is thicker than the first complementary sublayer, or each first complementary sublayer, of the active layer.

9. The light-emitting semiconductor device of claim 5 wherein one of the confining semiconductor layers is a lamination of alternating first and second sublayers, each first sublayer being of $Al_xGa_{1-x}N$ where the subscript x is a numeral that is greater than zero and equal to or less than one and having a thickness determined to offer a quantum-mechanical tunnel effect, each second sublayer being of $Al_yGa_{1-y}N$ where the subscript y is equal to or greater than zero, less than one, and less than x in the formula defining materials for the first sublayer, and having a thickness in the range of from about 10 to about 500 nanometers, and being thicker than each first sublayer.

* * * * *